United States Patent
Arai

(10) Patent No.: US 9,627,241 B2
(45) Date of Patent: Apr. 18, 2017

(54) RESIN SHEET ATTACHING METHOD

(71) Applicant: DISCO CORPORATION, Tokyo (JP)

(72) Inventor: Kazuhisa Arai, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 209 days.

(21) Appl. No.: 14/325,820

(22) Filed: Jul. 8, 2014

(65) Prior Publication Data

US 2015/0013897 A1 Jan. 15, 2015

(30) Foreign Application Priority Data

Jul. 10, 2013 (JP) .................................. 2013-144182

(51) Int. Cl.
*B32B 38/00* (2006.01)
*H01L 21/683* (2006.01)
*H01L 23/00* (2006.01)
*C09J 5/02* (2006.01)
*B32B 37/00* (2006.01)

(52) U.S. Cl.
CPC ...... *H01L 21/6836* (2013.01); *B32B 38/0008* (2013.01); *C09J 5/02* (2013.01); *H01L 24/29* (2013.01); *B32B 2037/0092* (2013.01); *B32B 2310/0831* (2013.01); *B32B 2457/14* (2013.01); *C09J 2205/31* (2013.01); *C09J 2400/226* (2013.01); *C09J 2400/228* (2013.01); *H01L 2221/6834* (2013.01); *H01L 2221/68318* (2013.01); *H01L 2221/68327* (2013.01); *H01L 2224/2919* (2013.01); *H01L 2924/12042* (2013.01)

(58) Field of Classification Search
CPC .... C09J 5/02; B32B 38/0008; H01L 21/6836; H01L 24/29
See application file for complete search history.

(56) References Cited

U.S. PATENT DOCUMENTS

| 2003/0094909 | A1* | 5/2003 | Hishinuma | ............ | B01J 19/123 |
| | | | | | 315/248 |
| 2006/0162850 | A1* | 7/2006 | Lake | .................. | H01L 21/6835 |
| | | | | | 156/153 |
| 2010/0260975 | A1* | 10/2010 | Sugimura | ............... | B29C 65/14 |
| | | | | | 428/166 |

FOREIGN PATENT DOCUMENTS

| JP | 2005-166969 | 6/2005 |
| JP | 2009-107084 | 5/2009 |

* cited by examiner

Primary Examiner — Daniel McNally
(74) Attorney, Agent, or Firm — Greer Burns & Crain, Ltd.

(57) ABSTRACT

A resin sheet attaching method of attaching a resin sheet to a workpiece. The resin sheet attaching method includes a molecular weight reducing step of applying vacuum ultraviolet radiation to the front side of the resin sheet, thereby cutting an intermolecular bond in a surface region having a depth of tens of nanometers from the front side of the resin sheet to thereby reduce the molecular weight of the surface region and produce an adhesive force, and a resin sheet attaching step of attaching the front side of the resin sheet to the workpiece after performing the molecular weight reducing step.

8 Claims, 6 Drawing Sheets

RESIN SHEET ATTACHING METHOD

BACKGROUND OF THE INVENTION

Field of the Invention

The present invention relates to a resin sheet attaching method of attaching a resin sheet to the front side or back side of a wafer.

Description of the Related Art

In a semiconductor device fabrication process, a plurality of crossing division lines are formed on the front side of a substantially disk-shaped semiconductor wafer to thereby partition a plurality of regions where a plurality of devices such as ICs and LSIs are respectively formed. The back side of the semiconductor wafer is ground by a grinding apparatus to reduce the thickness of the semiconductor wafer to a predetermined thickness. Thereafter, the semiconductor wafer is divided along the division lines by a cutting apparatus or a laser processing apparatus to thereby obtain the individual devices divided from each other.

The grinding apparatus for grinding the back side of a wafer such as a semiconductor wafer includes a chuck table having a holding surface for holding the wafer under suction, grinding means having a grinding wheel with abrasive members for grinding the wafer held on the holding surface of the chuck table, the grinding wheel being mounted on a rotating spindle, and feeding means for feeding the grinding means in a direction perpendicular to the holding surface of the chuck table. In operation, the front side of the wafer is held on the holding surface of the chuck table under suction, and the abrasive members of the grinding wheel is brought into contact with the back side of the wafer and fed by the feeding means, thereby grinding the back side of the wafer. In grinding the back side of the wafer, a protective tape is attached to the front side of the wafer, so as to protect the devices formed on the front side of the wafer (see Japanese Patent Laid-open No. 2009-107084, for example).

The cutting apparatus for dividing a wafer such as a semiconductor wafer into the individual devices along the division lines includes a chuck table having a holding surface for holding the wafer under suction, cutting means having a rotatable cutting blade for cutting the wafer held on the holding surface of the chuck table, and feeding means for relatively moving the chuck table and the cutting means in a feeding direction. In operation, the back side of the wafer is held on the holding surface of the chuck table under suction, and the cutting blade is positioned directly above each division line and fed to cut into the wafer. Thereafter, the chuck table and the cutting means are relatively moved in the feeding direction to thereby cut the wafer along each division line. Thus, the wafer is divided into the individual devices. In dividing the wafer, a dicing tape is attached to the back side of the wafer, so as to prevent scattering of the individual devices, and the dicing tape is supported at its peripheral portion to an annular frame (see Japanese Patent Laid-open No. 2005-166969, for example).

SUMMARY OF THE INVENTION

Both the protective tape and the dicing tape mentioned above have a configuration such that an adhesive is applied to the front side of a resin sheet such as a polyvinyl chloride sheet. Accordingly, there is a problem that the adhesive may adhere to the wafer to cause a reduction in quality of the devices.

Further, there are variations in thickness of the layer of the adhesive applied to the front side of the resin sheet, so that the thickness of the resin sheet with the adhesive layer to be attached to the wafer becomes nonuniform. This causes the following problem. In the case of grinding the back side of the wafer in the condition where the resin sheet is attached to the front side of the wafer, the thickness of the wafer cannot be reduced to a uniform thickness by grinding. Further, in the case of cutting the wafer along each division line formed on the front side of the wafer in the condition where the resin sheet is attached to the back side of the wafer, a cut groove having a uniform depth from the front side of the wafer cannot be formed.

It is therefore an object of the present invention to provide a resin sheet attaching method which can attach a resin sheet to a workpiece to obtain a uniform thickness.

In accordance with an aspect of the present invention, there is provided a resin sheet attaching method of attaching a resin sheet to a workpiece, the method including a molecular weight reducing step of applying vacuum ultraviolet radiation to the front side of the resin sheet, thereby cutting an intermolecular bond in a surface region having a depth of tens of nanometers from the front side of the resin sheet to thereby reduce the molecular weight of the surface region and produce an adhesive force; and a resin sheet attaching step of attaching the front side of the resin sheet to the workpiece after performing the molecular weight reducing step.

Preferably, the molecular weight reducing step is performed by using an excimer lamp for applying vacuum ultraviolet radiation having a wavelength of 200 to 10 nm. Preferably, the workpiece includes a wafer having a plurality of devices formed on the front side of the wafer, and the front side of the resin sheet is attached to the front side or back side of the wafer in the resin sheet attaching step.

Preferably, the workpiece includes a wafer having a device area where a plurality of devices are formed on the front side of the wafer and a peripheral marginal area surrounding the device area, and the vacuum ultraviolet radiation is applied to only a peripheral area on the front side of the resin sheet corresponding to the peripheral marginal area of the wafer in the molecular weight reducing step.

The resin sheet attaching method according to the present invention includes the molecular weight reducing step of applying vacuum ultraviolet radiation to the front side of the resin sheet, thereby cutting an intermolecular bond in a surface region having a depth of tens of nanometers from the front side of the resin sheet to thereby reduce the molecular weight of the surface region and produce an adhesive force, and the resin sheet attaching step of attaching the front side of the resin sheet to the workpiece after performing the molecular weight reducing step. Accordingly, it is unnecessary to apply an adhesive to the front side of the resin sheet and it is possible to solve the problem that the adhesive may adhere to a workpiece such as a wafer to reduce the quality of the devices.

Further, since no adhesive is applied to the front side of the resin sheet, it is possible to solve the problem that the thickness of a workpiece such as a wafer cannot be reduced to a uniform thickness by grinding due to variations in thickness of the adhesive layer or the problem that a cut groove having a uniform depth from the front side of a workpiece such as a wafer cannot be formed due to variations in thickness of the adhesive layer.

The above and other objects, features and advantages of the present invention and the manner of realizing them will become more apparent, and the invention itself will best be understood from a study of the following description and

DETAILED DESCRIPTION OF THE PREFERRED EMBODIMENTS

Figure 1:
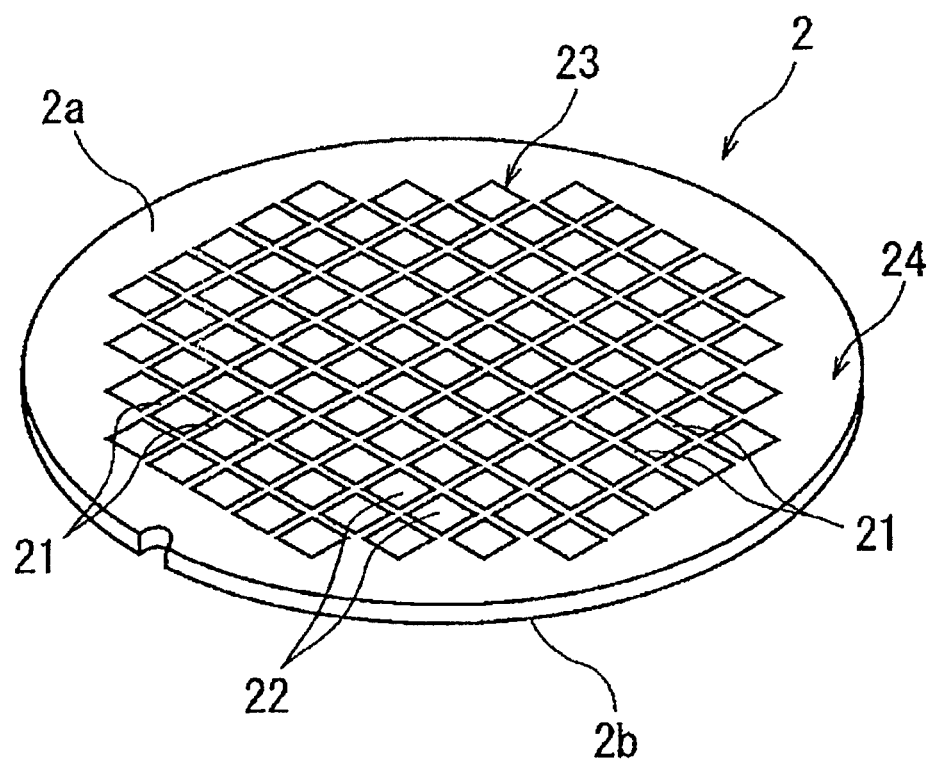
FIG. 1 is a perspective view of a semiconductor wafer as a workpiece.

A preferred embodiment of the resin sheet attaching method according to the present invention will now be described in detail with reference to the attached drawings. FIG. 1 is a perspective view of a semiconductor wafer 2 as a workpiece. The semiconductor wafer 2 shown in FIG. 1 is a circular silicon wafer, which has a front side 2a and a back side 2b. A plurality of crossing division lines 21 are formed on the front side 2a of the semiconductor wafer 2 to thereby define a plurality of separate regions where a plurality of devices 22 such as ICs and LSIs are respectively formed. The front side 2a of the semiconductor wafer 2 includes a device area 23 where the devices 22 are formed and a peripheral marginal area 24 surrounding the device area 23. There will now be described a method of attaching a resin sheet to the front side 2a or the back side 2b of the semiconductor wafer 2.

Figure 2:
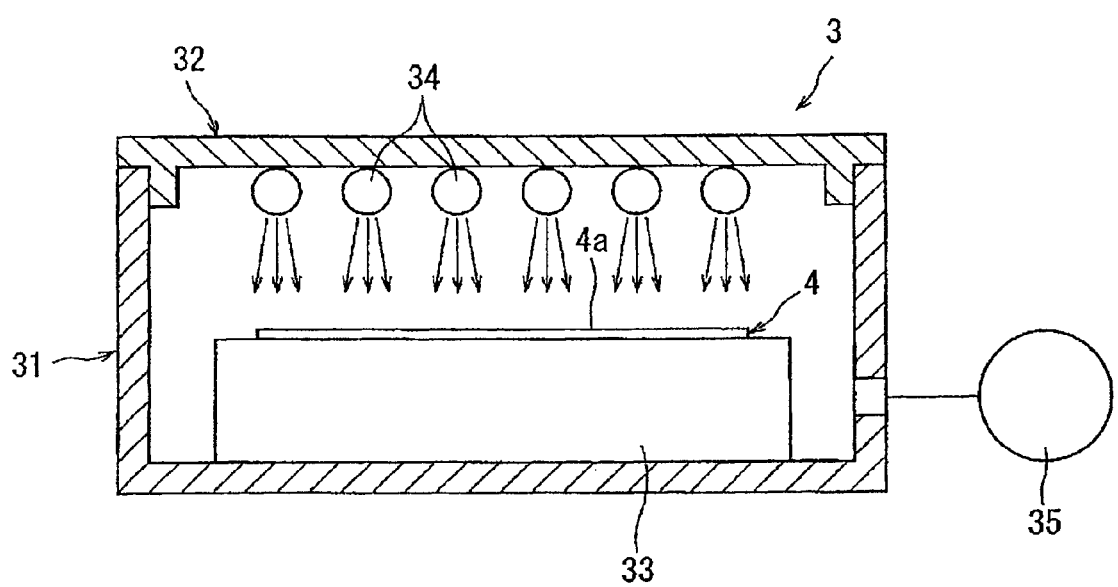
FIG. 2 is a schematic illustration of a molecular weight reducing step in a resin sheet attaching method according to a preferred embodiment of the present invention.

More specifically, there will now be described a method of attaching a resin sheet to the front side 2a of the semiconductor wafer 2, so as to protect the devices 22 formed on the front side 2a of the semiconductor wafer 2 in grinding the back side 2b of the semiconductor wafer 2 to reduce the thickness of the semiconductor wafer 2 to a predetermined thickness. First, a molecular weight reducing step is performed in such a manner that vacuum ultraviolet radiation is applied to the front side of the resin sheet to be attached to the front side 2a of the semiconductor wafer 2, thereby cutting an intermolecular bond in a surface region having a depth of tens of nanometers from the front side of the resin sheet to thereby reduce the molecular weight of the surface region and produce an adhesive force. This molecular weight reducing step is performed by using a molecular weight reducing apparatus 3 shown in FIG. 2. The molecular weight reducing apparatus 3 is composed of a treatment case 31 having an upper opening, a case lid 32 for closing the upper opening of the treatment case 31, a workpiece mounting table 33 provided in the treatment case 31 for mounting the workpiece, and a vacuum ultraviolet lamp 34 provided on the inner surface of the case lid 32. The treatment case 31 of the molecular weight reducing apparatus 3 is in communication with evacuating means 35. The vacuum ultraviolet lamp 34 is provided by an excimer lamp for applying vacuum ultraviolet radiation having a wavelength of 172 nm with a power of 100 W, for example. However, any lamp for applying vacuum ultraviolet radiation having a wavelength of 200 to 10 nm may be used as the vacuum ultraviolet lamp 34.

In performing the molecular weight reducing step using the molecular weight reducing apparatus 3 mentioned above, the case lid 32 is first opened to mount a resin sheet 4 on the workpiece mounting table 33. The resin sheet 4 is provided by a polyvinyl chloride sheet having a thickness of 100 μm, for example. The resin sheet 4 has a circular shape and substantially the same size as that of the semiconductor wafer 2. However, any resin sheet formed of polyethylene terephthalate or polyolefin, for example, may be used as the resin sheet 4. After mounting the resin sheet 4 on the workpiece mounting table 33 as mentioned above, the case lid 32 is closed and the evacuating means 35 is next operated to reduce the pressure inside the treatment case 31 to about 100 Pa. Thereafter, the vacuum ultraviolet lamp 34 is operated to apply vacuum ultraviolet radiation to the front side 4a of the resin sheet 4 mounted on the workpiece mounting table 33 (molecular weight reducing step).

Figure 3:
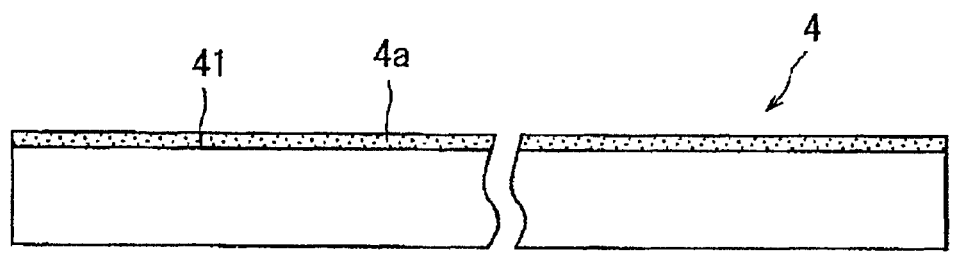
FIG. 3 is an enlarged view of an essential part of a resin sheet processed by the molecular weight reducing step shown in FIG. 2.

By applying vacuum ultraviolet radiation in the molecular weight reducing step as mentioned above, a compound action occurs in such a manner that molecules are excited and ambient oxygen is activated. As a result, an intermolecular bond in a surface region having a depth of tens of nanometers from the front side 4a of the resin sheet 4 is cut and a polar group is produced to thereby reduce the molecular weight of the surface region and produce an adhesive force. In this preferred embodiment, vacuum ultraviolet radiation having a wavelength of 172 nm with a power of 100 W is applied to a polyvinyl chloride sheet having a thickness of 100 μm as the resin sheet 4 for 10 minutes in the condition where the pressure inside the treatment case 31 is reduced to 100 Pa, thereby forming an adhesive layer 41 having a thickness of 30 to 50 nm in the surface region on the front side 4a of the resin sheet 4 as shown in FIG. 3. This adhesive layer 41 is formed without variations in thickness, i.e., has a uniform thickness.

Figure 4:
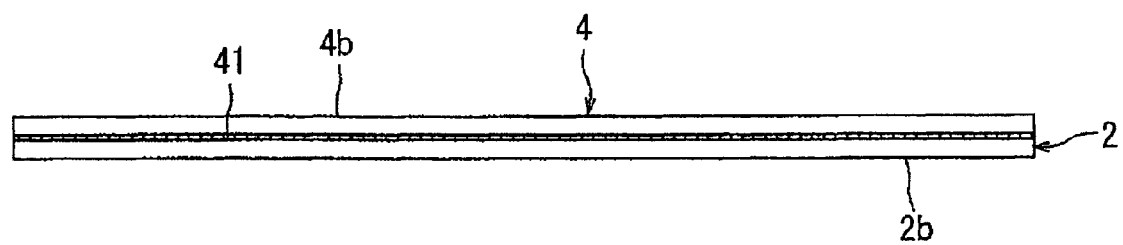
FIG. 4 is a schematic illustration of a resin sheet attaching step in the resin sheet attaching method.

After performing the molecular weight reducing step as mentioned above, a resin sheet attaching step is performed in such a manner that the front side 4a of the resin sheet 4 processed by the molecular weight reducing step is attached to the front side 2a of the semiconductor wafer 2. More specifically, as shown in FIG. 4, the adhesive layer 41 formed on the front side 4a of the resin sheet 4 is attached to the front side 2a of the semiconductor wafer 2. In the condition where the resin sheet 4 is attached to the front side 2a of the semiconductor wafer 2 as mentioned above, the distance between the back side 2b of the semiconductor wafer 2 and the back side 4b of the resin sheet 4 is uniform because the thickness of the adhesive layer 41 of the resin sheet 4 is uniform as mentioned above.

After performing the resin sheet attaching step as mentioned above, the semiconductor wafer 2 with the resin sheet 4 is transferred to a grinding apparatus (not shown) for performing a back grinding step of grinding the back side 2b of the semiconductor wafer 2 to reduce the thickness of the semiconductor wafer 2 to a predetermined thickness. In this back grinding step, the resin sheet 4 attached to the front side 2a of the semiconductor wafer 2 is held under suction on a holding surface of a chuck table included in the grinding apparatus. In this condition, abrasive members of a grinding wheel are brought into contact with the back side 2b of the semiconductor wafer 2 and then fed toward the holding surface of the chuck table to thereby grind the back side 2b of the semiconductor wafer 2. As described above, the distance between the back side 2b of the semiconductor wafer 2 held on the holding surface of the chuck table of the grinding apparatus and the back side 4b of the resin sheet 4 attached to the front side 2a of the semiconductor wafer 2 is uniform. Accordingly, the back side 2b of the semiconductor wafer 2 can be uniformly ground to reduce the thickness of the semiconductor wafer 2 to a uniform thickness.

Figure 5A:
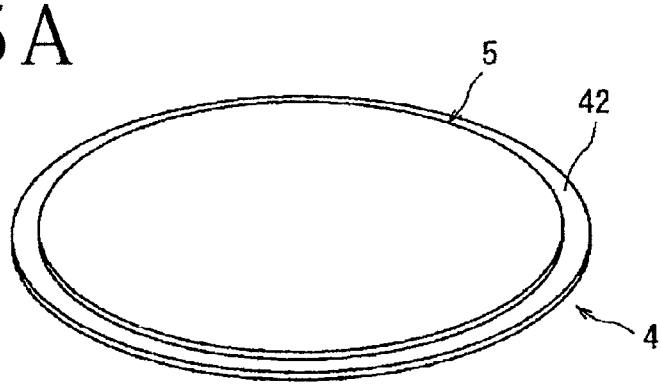
FIGS. 5A to 5C are schematic illustrations showing another preferred embodiment of the molecular weight reducing step.
Figure 5B:
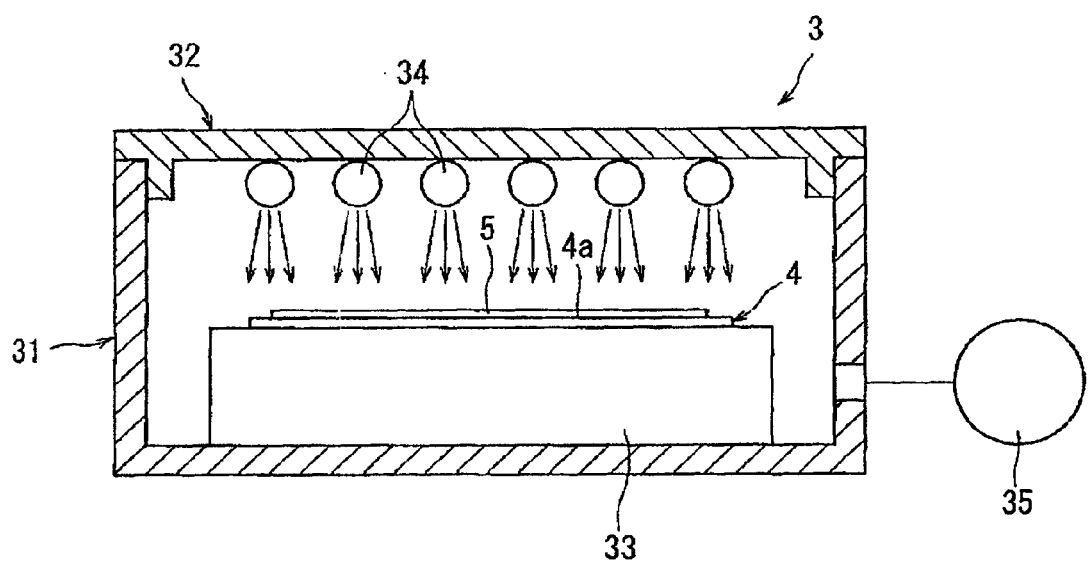
Figure 5C:
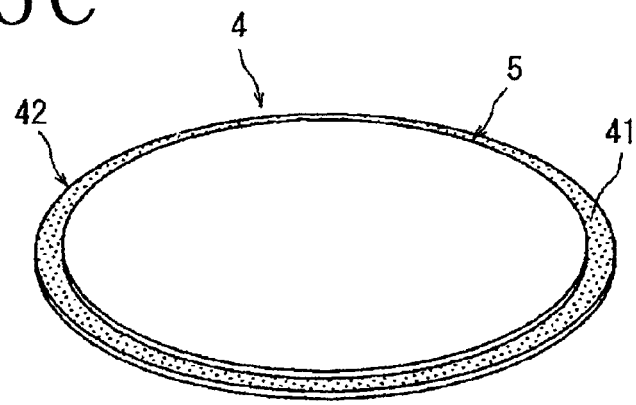

Another preferred embodiment of the molecular weight reducing step will now be described with reference to FIGS. 5A to 5C. The molecular weight reducing step in this preferred embodiment is performed in the case that the devices 22 formed on the front side 2a of the semiconductor wafer 2 shown in FIG. 1 are MEMS (Micro Electro Mechanical Systems) devices. In the case that the devices 22 are MEMS devices, there is a problem such that if the resin sheet 4 as a protective member is attached to the front side 2a of the semiconductor wafer 2, the MEMS devices may be damaged in peeling the resin sheet 4. Accordingly, to solve this problem, it is necessary to use a resin sheet having an adhesive layer in only a peripheral area corresponding to the peripheral marginal area 24 of the semiconductor wafer 2 shown in FIG. 1, i.e., not having an adhesive layer in a central area corresponding to the device area 23 of the semiconductor wafer 2 shown in FIG. 1.

The molecular weight reducing step in this preferred embodiment is performed in the following manner. As shown in FIG. 5A, a mask 5 is provided on the front side 4a of the resin sheet 4 in the central area corresponding to the device area 23 of the semiconductor wafer 2 (masking step). Accordingly, the front side 4a of the resin sheet 4 is partially exposed in an annular area 42 corresponding to the peripheral marginal area 24 of the semiconductor wafer 2 as shown in FIG. 5A. After performing this masking step, the resin sheet 4 is mounted on the workpiece mounting table 33 of the molecular weight reducing apparatus 3 shown in FIG. 2 in the condition that the mask 5 is oriented upward. In this condition, the molecular weight reducing step mentioned above is similarly performed as shown in FIG. 5B. As a result, vacuum ultraviolet radiation is applied to only the annular area 42 on the front side 4a of the resin sheet 4 corresponding to the peripheral marginal area 24 of the semiconductor wafer 2. Accordingly, as shown in FIG. 5C, an adhesive layer 41 is formed in only the annular area 42 on the front side 4a of the resin sheet 4 corresponding to the peripheral marginal area 24 of the semiconductor wafer 2.

Figure 6A:
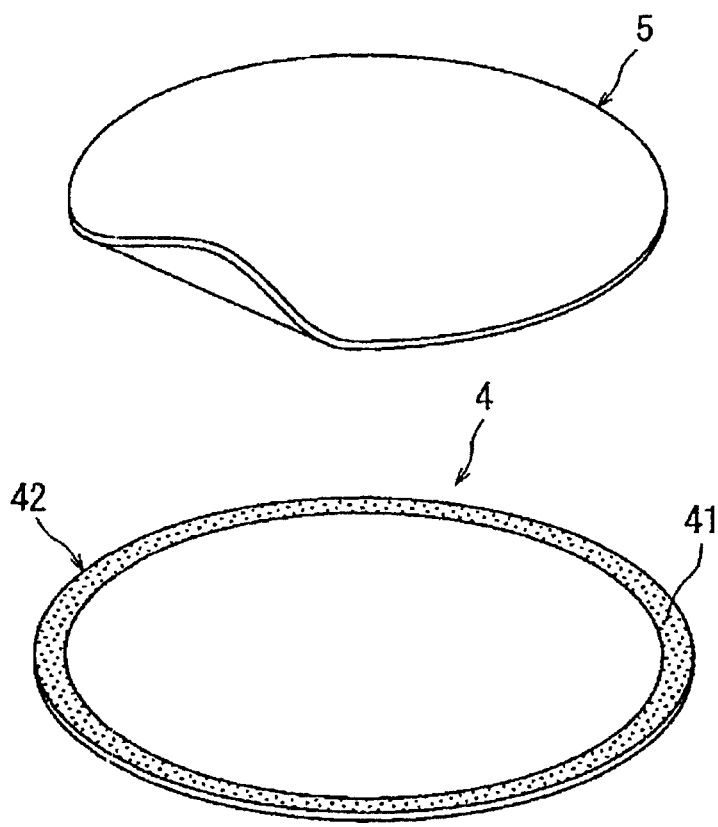
FIG. 6A is a perspective view of a resin sheet processed by the molecular weight reducing step shown in FIG. 5B.
Figure 6B:
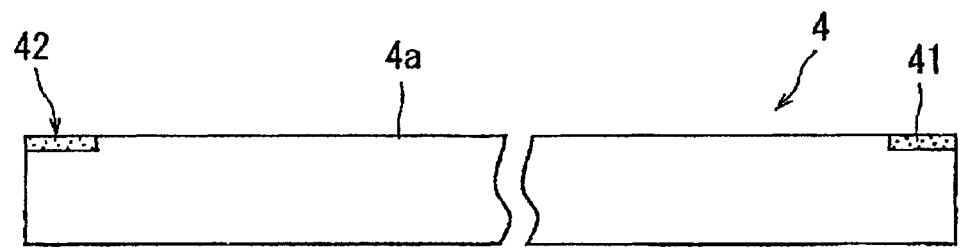
FIG. 6B is an enlarged view of an essential part of the resin sheet shown in FIG. 6A.

After forming the adhesive layer 41 as mentioned above, the mask 5 is removed from the central area of the front side 4a of the resin sheet 4 corresponding to the device area 23 of the semiconductor wafer 2 as shown in FIG. 6A, thereby obtaining the resin sheet 4 with the adhesive layer 41 formed in only the annular area 42 on the front side 4a of the resin sheet 4 corresponding to the peripheral marginal area 24 of the semiconductor wafer 2. As shown in FIG. 6B, the adhesive layer 41 formed in only the annular area 42 on the front side 4a of the resin sheet 4 corresponding to the peripheral marginal area 24 of the semiconductor wafer 2 is flush with the central area on the front side 4a of the resin sheet 4. Accordingly, overall flatness of the front side 4a of the resin sheet 4 can be maintained.

When the front side 4a of the resin sheet 4 is next attached to the front side 2a of the semiconductor wafer 2, the adhesive layer 41 formed in only the annular area 42 of the resin sheet 4 sticks to only the peripheral marginal area 24 of the semiconductor wafer 2. That is, the adhesive layer 41 of the resin sheet 4 does not stick to the device area 23 where the MEMS devices are formed. Accordingly, even when the resin sheet 4 is peeled from the front side 2a of the semiconductor wafer 2 after performing a back grinding step of grinding the back side 2b of the semiconductor wafer 2, there is no possibility that the MEMS devices may be damaged.

Figure 7A:
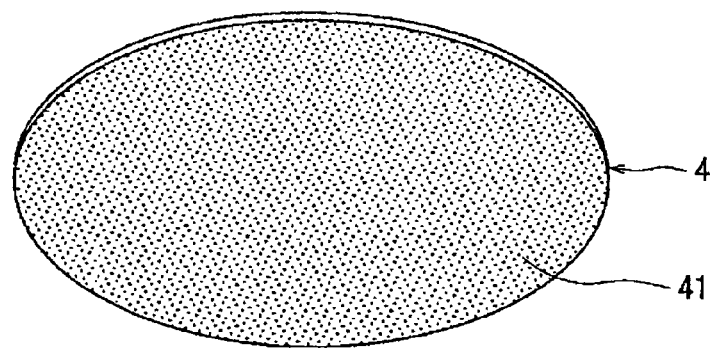
FIGS. 7A to 7C are schematic illustrations showing another preferred embodiment of the resin sheet attaching step.
Figure 7B:
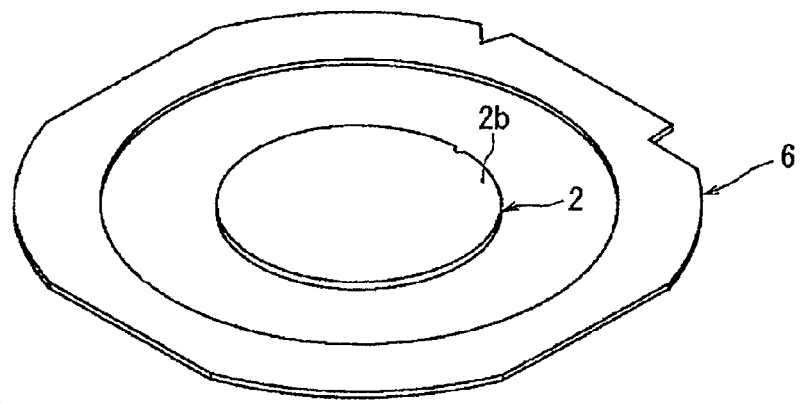
Figure 7B:
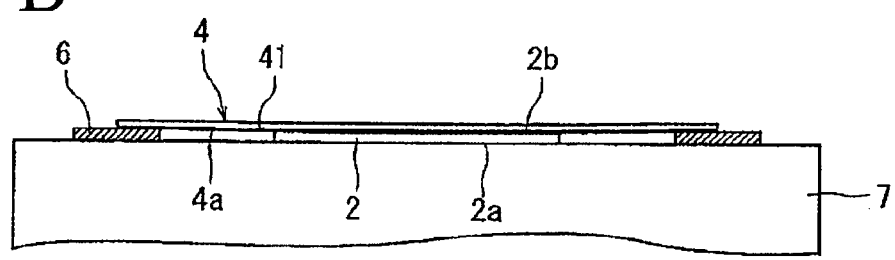
Figure 7C:
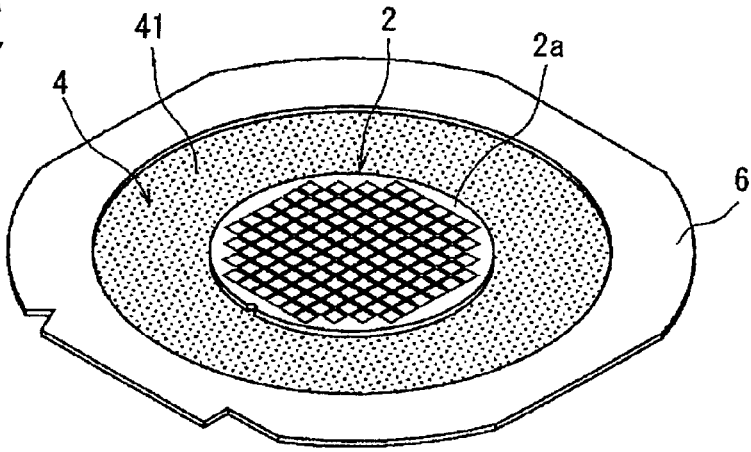

Another preferred embodiment of the resin sheet attaching step will now be described with reference to FIGS. 7A to 7C. In this preferred embodiment, the resin sheet 4 is used as a dicing tape in such a manner that a central portion of the resin sheet 4 is attached to the back side 2b of the semiconductor wafer 2 and a peripheral portion of the resin sheet 4 is supported to an annular frame 6. As shown in FIGS. 7A to 7C, the resin sheet 4 has a diameter larger than the diameter of the semiconductor wafer 2 and has the outer diameter larger than the inner diameter of the annular frame 6. The resin sheet 4 has an adhesive layer 41 entirely formed on the front side 4a by performing the molecular weight reducing step using the molecular weight reducing apparatus 3 shown in FIG. 2. There will now be described the resin sheet attaching step of attaching the central portion of the resin sheet 4 having the adhesive layer 41 on the front side 4a to the back side 2b of the semiconductor wafer 2 and supporting the peripheral portion of the resin sheet 4 to the annular frame 6. As shown in FIGS. 7A and 7B, the annular frame 6 is mounted on a holding table 7 and the semiconductor wafer 2 is also mounted on the holding table 7 so as to be positioned at a central portion of the annular frame 6. At this time, the semiconductor wafer 2 is mounted on the holding table 7 in the condition where the back side 2b is oriented upward, i.e., the front side 2a is in contact with the upper surface of the holding table 7. Thereafter, the central portion of the adhesive layer 41 formed on the front side 4a of the resin sheet 4 processed by the molecular weight reducing step is attached to the back side 2b of the semiconductor wafer 2, and the peripheral portion of the adhesive layer 41 is attached to the annular frame 6 as shown in FIG. 7B. In this manner, the semiconductor wafer 2 is supported through the resin sheet 4 to the annular frame 6 in the condition where the front side 2a of the semiconductor wafer 2 is exposed as shown in FIG. 7C.

The semiconductor wafer 2 supported through the resin sheet 4 to the annular frame 6 is next transferred to a cutting apparatus (not shown) for cutting the semiconductor wafer 2 along the division lines 21 to divide it into the individual devices 22 (dividing step). This dividing step using the cutting apparatus is performed by holding the semiconductor wafer 2 on a chuck table in the condition where the resin sheet 4 is in contact with the upper surface of the chuck table and rotating a cutting blade to cut the semiconductor wafer 2 along the division lines 21. Since the thickness of the adhesive layer 41 of the resin sheet 4 is uniform as described above, the distance between the front side 2a of the semiconductor wafer 2 and the back side 4b of the resin sheet 4 is uniform. Accordingly, a cut groove having a uniform depth from the front side 2a of the semiconductor wafer 2 can be formed along each division line 21 in this dividing step. Further, since the resin sheet 4 has the adhesive layer 41 formed by performing the molecular weight reducing step mentioned above, it is unnecessary to apply an adhesive to the front side 4a of the resin sheet 4. Accordingly, it is possible to solve the problem that the adhesive may adhere to a workpiece such as a wafer to reduce the quality of the devices.

Having thus described specific preferred embodiments of the present invention, it should be noted that the present invention is not limited to the above preferred embodiments, but various modifications may be made within the scope of the present invention. For example, while the molecular weight reducing step in the above preferred embodiments is performed for a resin sheet having a predetermined shape, the molecular weight reducing step may be performed for a beltlike resin sheet and this beltlike resin sheet processed by the molecular weight reducing step may be cut into a predetermined shape.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A resin sheet attaching method of attaching a resin sheet to a workpiece, the method comprising:
   a pressure reducing step comprising mounting said resin sheet within a case and reducing the pressure inside the treatment case to a predetermined vacuum pressure;
   a molecular weight reducing step of applying vacuum ultraviolet radiation to a front side of said resin sheet, thereby cutting an intermolecular bond in a surface region having a depth of tens of nanometers from the front side of said resin sheet to thereby reduce the molecular weight of said surface region and produce an adhesive force, wherein said molecular weight reducing step is performed while said resin sheet is within said case while the pressure within the case is at the predetermined vacuum pressure; and
   a resin sheet attaching step of attaching the front side of said resin sheet to said workpiece after performing said molecular weight reducing step,
   wherein said molecular weight reducing step is not performed upon said workpiece, but is only performed upon said resin sheet.

2. The resin sheet attaching method according to claim 1, wherein said workpiece includes a wafer having a device area where a plurality of devices are formed on a front side of said wafer and a peripheral marginal area surrounding said device area, and said vacuum ultraviolet radiation is applied to only a peripheral area on the front side of said resin sheet corresponding to said peripheral marginal area of said wafer in said molecular weight reducing step.

3. The resin sheet attaching method according to claim 2, further comprising:
   a masking step of providing a mask to a central area of the front side of said wafer prior to performing said molecular weight reducing step, whereby due to said mask, said vacuum ultraviolet radiation is applied to said peripheral marginal area but not to said device area.

4. The resin sheet attaching method according to claim 1, wherein said molecular weight reducing step is performed by using an excimer lamp for applying vacuum ultraviolet radiation having a wavelength of 200 to 10 nm.

5. The resin sheet attaching method according to claim 1, wherein said workpiece includes a wafer having a plurality of devices formed on a front side of said wafer, and the front side of said resin sheet is attached to the front side or back side of said wafer in said resin sheet attaching step.

6. The resin sheet attaching method according to claim 1, wherein said workpiece comprises a silicon wafer.

7. A resin sheet attaching method of attaching a resin sheet to a workpiece, the method comprising:
   a pressure reducing step comprising mounting said resin sheet within a case and reducing the pressure inside the treatment case to a predetermined vacuum pressure;
   a molecular weight reducing step of applying vacuum ultraviolet radiation to a front side of said resin sheet, thereby cutting an intermolecular bond in a surface region having a depth of tens of nanometers from the front side of said resin sheet to thereby reduce the molecular weight of said surface region and produce an adhesive force, wherein said molecular weight reducing step is performed while said resin sheet is within said case while the pressure within the case is at the predetermined vacuum pressure;
   a resin sheet attaching step of attaching the front side of said resin sheet to said workpiece after performing said molecular weight reducing step;
   wherein said resin sheet has a thickness of 100 μm, and
   wherein said molecular weight reducing step results in an adhesive layer with a thickness of between 30 to 50 nm.

8. A resin sheet attaching method of attaching a resin sheet to a workpiece, the method comprising:
   a pressure reducing step comprising mounting said resin sheet within a case and reducing the pressure inside the treatment case to a predetermined vacuum pressure;
   a molecular weight reducing step of applying vacuum ultraviolet radiation to a front side of said resin sheet, thereby cutting an intermolecular bond in a surface region having a depth of tens of nanometers from the front side of said resin sheet to thereby reduce the molecular weight of said surface region and produce an adhesive force, wherein said molecular weight reducing step is performed while said resin sheet is within said case while the pressure within the case is at the predetermined vacuum pressure;
   a resin sheet attaching step of attaching the front side of said resin sheet to said workpiece after performing said molecular weight reducing step;
   wherein the predetermined vacuum pressure is 100 Pa.

* * * * *